(12) United States Patent
Chan et al.

(10) Patent No.: US 10,303,048 B2
(45) Date of Patent: May 28, 2019

(54) METAL OF CERAMIC MATERIAL HARDENED PATTERN

(71) Applicants: IMEC VZW, Leuven (BE); KATHOLIEKE UNIVERSITEIT LEUVEN, KU LEUVEN R&D, Leuven (BE)

(72) Inventors: Boon Teik Chan, Leuven (BE); Arjun Singh, Heverlee (BE); Safak Sayan, Tervuren (BE)

(73) Assignees: IMEC VZW, Leuven (BE); KATHOLIEKE UNIVERSITEIT LEUVEN, KU LEUVEN R&D, Leuven (BE)

(*) Notice: Subject to any disclaimer, the term of this patent is extended or adjusted under 35 U.S.C. 154(b) by 50 days.

(21) Appl. No.: 15/433,397

(22) Filed: Feb. 15, 2017

(65) Prior Publication Data
US 2017/0242335 A1    Aug. 24, 2017

(30) Foreign Application Priority Data
Feb. 19, 2016    (EP) .................................... 16156539

(51) Int. Cl.
| | | |
|---|---|---|
| B32B 7/00 | (2019.01) | |
| G03F 7/00 | (2006.01) | |
| H01L 21/033 | (2006.01) | |
| H01L 21/027 | (2006.01) | |

(52) U.S. Cl.
CPC ........ *G03F 7/0002* (2013.01); *H01L 21/0271* (2013.01); *H01L 21/0337* (2013.01); *Y10T 428/24917* (2015.01); *Y10T 428/24926* (2015.01)

(58) Field of Classification Search
None
See application file for complete search history.

(56) References Cited

U.S. PATENT DOCUMENTS

| | | | |
|---|---|---|---|
| 8,900,467 B1 * | 12/2014 | Chapuis | ............... G03F 7/0002 216/41 |
| 2012/0046421 A1 | 2/2012 | Darling et al. | |
| 2013/0209755 A1 * | 8/2013 | Hustad | ............... B81C 1/00031 428/195.1 |

(Continued)

OTHER PUBLICATIONS

European Search Report, European Patent Application No. 16156539.5, dated Aug. 10, 2016, 8 pages.

*Primary Examiner* — Seth Dumbris
(74) *Attorney, Agent, or Firm* — McDonnell Boehnen Hulbert & Berghoff LLP

(57) ABSTRACT

The present disclosure relates to a patterned structure, the structure comprising:
 i) a substrate,
 ii) a first layer on top of the substrate, comprising a filler material and a guiding material, wherein at least a top surface of the first layer comprises one or more zones of filler material and one or more zones of guiding material, and
 iii) a second layer on top of the first layer comprising a pattern of a first material, the pattern being either aligned or anti-aligned with the underlying one or more zones of guiding material;
wherein the first material comprises a metal or a ceramic material and wherein the guiding material and the filler material either both comprise or both do not comprise the metal or ceramic material.

23 Claims, 6 Drawing Sheets

(56) References Cited

U.S. PATENT DOCUMENTS

2014/0030652 A1* 1/2014 Senzaki .......... C08L 53/00
 430/270.1
2014/0287083 A1 9/2014 Gao et al.
2015/0225850 A1 8/2015 Arora et al.

* cited by examiner

METAL OF CERAMIC MATERIAL HARDENED PATTERN

RELATED APPLICATION

This application claims priority from EP 16156539.5, filed Feb. 19, 2016, which is incorporated by reference in its entirety.

TECHNICAL FIELD OF THE DISCLOSURE

The present disclosure relates to patterned structures for use in the semiconductor industry, and in particular to such patterned structures where the pattern is hardened with a metal or ceramic material.

BACKGROUND OF THE DISCLOSURE

Patterned materials, such as obtained through the directed self-assembly (DSA) of block copolymers, has been proposed for making etch masks. DSA of block copolymers uses guiding features in a sublayer to direct the block copolymer film formation. After the block copolymer components self-assemble on the sublayer, one of the polymer blocks can be selectively removed, leaving the other block with the desired pattern. This patterned block can in turn be used as an etch mask to transfer the pattern into an underlying substrate (100); for example for use in semiconductor manufacturing, such as in manufacturing dynamic random-access memory (DRAM) devices. However, it was reported that the DSA patterned block copolymer lines do not yet meet the semiconductor industry specification for the line edge roughness, i.e. a measure for the deviation between the actual shape of a pattern feature sidewall and its intended shape (typically quantified as 3 times the standard deviation from the intended shape), and line width roughness, i.e. a measure for the deviation between the actual width of a pattern feature and its intended width (typically quantified as 3 times the standard deviation of the width).

In order to improve the etch selectivity for the block copolymer, a more recent approach, called sequential infiltration synthesis (SIS), was developed for selectively hardening one type of the block copolymer sections by infusing it with an inorganic material. In one example of SIS, a poly(styrene-block-methyl methacrylate) (PS-b-PMMA) block copolymer is self-assembled onto a substrate to form a pattern of the block copolymer sections. A trimethylaluminium (TMA) inorganic precursor is then introduced and infiltrates the PMMA, but does not react with the PS. Subsequently, an oxidant such as water is introduced to finish the reaction, thereby forming the alumina inorganic material in the locations in the PMMA where the TMA attached. This infiltration of the precursor and formation of the inorganic material is typically repeated until a desired level of infusion has been reached. Finally, the PS is removed, leaving a pattern that generally replicates the original pattern of the PMMA but that is now hardened by the inorganic material. This hardening typically improves the line edge roughness, the line width roughness and the etch resistance, as compared to the initial polymer sections, and thus makes the hardened pattern a more suitable etch mask.

However, after PS removal and pattern transfer, pitch walking, i.e. a systematic and periodic change in the pitch compared to the original pitch, is typically observed in the transferred pattern, thereby causing any further pattern that is transferred into the substrate to differ from that original pattern. Thus, there is still a need within the art for patterned structures, and methods for the fabrication thereof, comprising a pattern of hardened material which can be transferred more correctly into underlying layers.

SUMMARY OF THE DISCLOSURE

It is an object of the present disclosure to provide good structures and methods for hardening the pattern of a first material while minimizing the alterations to the pattern or to the transfer thereof.

It is an advantage of embodiments of the present disclosure that toppling, such as bending or collapsing, or pitch walking of features of the pattern can be eliminated, or at least reduced.

It is an advantage of embodiments of the present disclosure that the pattern may be constructed using a self-assembled material.

It is an advantage of embodiments of the present disclosure that the pattern
may be (anti-)aligned to guiding features in the underlying layer.

It is an advantage of embodiments of the present disclosure that the obtained pattern can be suitable as an etch mask to pattern the underlying substrate.

The above objective is accomplished by a method and device according to the present disclosure.

In a first aspect, the present disclosure relates to a patterned structure, comprising:
  i. a substrate (100),
  ii. a first layer (200) on top of the substrate (100), comprising a filler material (220, 240) and a guiding material (210, 230), wherein at least a top surface of the first layer (200) comprises one or more zones of filler material (220, 240) and one or more zones of guiding material (210, 230), and
  iii. a second layer (300) on top of the first layer (200) comprising a pattern of a first material (330), the pattern being either aligned or anti-aligned with the underlying one or more zones of guiding material (210, 230);

wherein the first material (330) comprises a metal or a ceramic material and wherein the guiding material (210, 230) and the filler material (220, 240) either both comprise or both do not comprise the metal or ceramic material.

In a second aspect, the present disclosure relates to a method for obtaining a patterned structure according to any of the previous claims, comprising:
  a. providing a substrate (100),
  b. forming, on top of the substrate (100), a first layer (200) comprising a filler material (220) and a guiding material (210), wherein at least a top surface of the first layer (200) comprises one or more zones of filler material (220) and one or more zones of guiding material (210), and
  c. forming, on top of the first layer (200), a second layer (300) comprising a pattern of a first material (310), the pattern being either aligned or anti-aligned with the underlying one or more zones of guiding material (210), and
  d. infusing the first material (310) with a metal or ceramic material, in such a way that the guiding material (210, 230) and the filler material (220, 240) either are both also infused with the metal or ceramic material or are both not infused with the metal or ceramic material.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from conventional practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
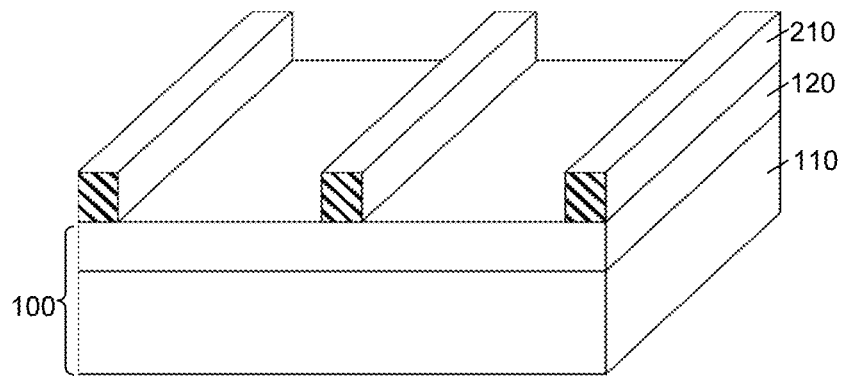
FIG. 1 shows a schematic representation of a step in a sequence of steps to obtain and use a patterned structure according to an embodiment of the present disclosure. A substrate (100) was provided, comprising a Si wafer (110) and a spin-on-glass (SOG) hardmask (120) thereon. Lines of cross linkable PMMA (X-PMMA) guiding material (210) were lithographically fabricated onto this hardmask (120).

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various aspects of the disclosure. This method of disclosure, however, is not to be interpreted as reflecting an intention that the claimed disclosure requires more features than are expressly recited in each claim. Rather, as the following claims reflect, aspects of the disclosure lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment can be an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The following terms are provided solely to aid in the understanding of the disclosure.

As used herein, when a pattern of a first material is said to be aligned with underlying one or more zones of guiding material, it is understood that the placement of the pattern with respect to the underlying one or more zones is such that a section of the first material can be typically present above each of the one or more zones of guiding material. The pattern of the first material may typically have a bottom surface comprising one or more zones of first material and the placement of the aligned pattern may be such that the contacting area between the one or more zones of first material and the one or more zones of guiding material can be maximized. For example, in a special case, the one or more zones of first material may have substantially the same dimensions as the one or more zones of guiding material and the borders of the one or more zones of first material may substantially line up with the borders of the one or more zones of guiding material. It should be noted that, while a section of the first material can be typically present above each of the one or more zones of guiding material, the reverse need not be true: a zone of guiding material may not be necessarily present beneath each section of the first material. For example, the zones of guiding material may form a pattern of lines with a first pitch and the pattern of a first material may be comprised of lines with a second pitch; wherein the first pitch may typically be a multiple of the second pitch.

As used herein, when a pattern of a first material is said to be anti-aligned with underlying one or more zones of guiding material, it can be meant that the placement of the pattern with respect to the underlying one or more zones is such that no section of the first material may present above a zone of guiding material. The pattern of the first material may typically have a bottom surface comprising one or more zones of first material and the placement of the anti-aligned pattern may be such that the overlapping area between the one or more zones of first material and the one or more zones of guiding material may be minimized. Alternatively, it may be considered that the pattern can be anti-aligned with underlying one or more zones when the negative of that pattern is aligned with these underlying one or more zones.

In a first aspect, the present disclosure relates to a patterned structure, comprising:
  i. a substrate,
  ii. a first layer on top of the substrate, comprising a filler material and a guiding material, wherein at least a top surface of the first layer comprises one or more zones of filler material and one or more zones of guiding material, and iii. a second layer on top of the first layer comprising a pattern of a first material, the pattern being either aligned or anti-aligned with the underlying one or more zones of guiding material;

wherein the first material comprises a metal or a ceramic material and wherein the guiding material and the filler material either both comprise or both do not comprise the metal or ceramic material.

The substrate may typically comprise one or more layers which are to be patterned. The substrate may for example comprise a hardmask layer which can be patterned and which can in turn be used in patterning underlying layers of the substrate.

At least a top surface of the first layer typically comprises one or more zones of guiding material, such as lines of guiding material, which guide the assembly, such as the self-assembly, of the second layer. In such a case, the self-assembly may also be called a directed self-assembly (DSA). The top surface further comprises one or more zones of filler material; The top surface may, for example, comprise one or more zones of guiding material in a matrix of filler material. The filler material may in some cases also be called a "brush" in the art. The assembly may typically be guided through a particular difference in wetting affinity of one or more materials in the second layer with respect to the guiding material and the filler material in the first layer. In some embodiments, the top surface of the one or more zones of guiding material may be coplanar to the top surface of the one or more zones of filler material.

The second layer comprises a first material in a pattern. The pattern may either be aligned or anti-aligned to the underlying one or more zones of guiding material. The second layer typically further comprises a second material, voids (e.g. trenches resulting from the removal of the second material), or a combination thereof.

The first material comprises a metal or ceramic material, and the guiding material and the filler material in the first layer either both comprise or both do not comprise the metal or ceramic material. The ceramic material may for example be a metal oxide or a metal nitride. The presence of the metal or ceramic material in the first material advantageously results in a hardened first material. In some embodiments, the first material and, optionally, both the guiding material and the filler material may be materials infused with a metal or ceramic material, such as the same metal or ceramic material. They may for example be materials infused by means of a sequential infiltration synthesis (SIS).

It was surprisingly found within the present disclosure that toppling and pitch walking within the pattern of the first material are due to a non-uniform hardening of the materials in the first layer (200) (FIG. 12, part a), i.e. due to either the guiding material or the filler material being hardened with the metal or ceramic material while the other is not. It was furthermore found that uniformly infusing the materials in the first layer (200) (FIG. 12, part b), i.e. so that the guiding material and filler material both comprise metal or ceramic material, alleviates these problems of toppling and pitch walking. Infusing the materials of the first layer can be advantageously achieved by using materials to which the metal or ceramic material, or at least a precursor of the metal or ceramic material, adsorbs. For example, both the guiding material and the filler material may comprise a monomer such as methyl methacrylate (MMA).

In an alternative embodiment, neither the guiding material nor the filler material are infused with the metal or ceramic material despite infusion in the second layer. Not infusing the materials of the first layer can be advantageously achieved by using only materials to which the metal or ceramic material, or at least a precursor of the metal or ceramic material, does not adsorb.

In embodiments, the pattern of the first material may comprise parallel lines and the second layer may comprise these parallel lines alternated with parallel lines of a further material and/or with voids.

A pattern of parallel lines may be advantageously used in the patterning of the substrate, such as in the fabrication of dynamic random-access memory (DRAM) devices or logic applications. In such cases, the voids may typically be trenches. In other embodiments, other patterns may be used. For example, the pattern may comprise cylindrical (or hexahedral) holes or vias, which can for instance be used to pattern connections between different metal levels in particular semiconducting devices.

The pattern of the second layer typically matches the features of the first layer, such as both comprise parallel lines. However, the pitch between both need not to be the same. For example, in one embodiment, the parallel guiding lines in the first layer typically have a pitch that may be a multiple of the pitch of the parallel lines of the first material in the second layer; the pitch of the guiding lines may for example be 3 times higher than the pitch of the parallel lines of the first material. In such a case, an advantageously smaller number of zones of guiding material can be provided through a lithographic technique and this smaller number can then advantageously be translated into a larger number of features in the pattern in the second layer.

In embodiments, the pattern of the first material may comprise a first portion of a self-assembled material and the further material, if present, may comprise a second portion of the self-assembled material.

The second layer may comprise a self-assembled material consisting of 2 portions, such as 2 portions that are chemically linked, wherein the second portion forms a matrix of further material and wherein the first portion advantageously self-assembles to the pattern of the first material in the matrix. In one embodiment, the pitch of the one or more zones of guiding material in the first layer can be substantially equal to, or to a multiple of, the natural pitch of the pattern of the first material, i.e. the pitch of the features of the pattern which the first potion of the self-assembled material assembles into when not guided. This advantageously allows the pattern to naturally align or anti-align to underlying one or more zones of guiding material, without undue strain. The pitch of the one or more zones of guiding material typically relates to the method of their production, such as to the parameters used in the lithography that can be employed to make them. The natural pitch of the pattern of the first material (330) typically relates to the particular chemical makeup of the self-assembled material; for example, when the self-assembled material is a block copolymer, it relates to the length of the polymer chains in the different blocks. Both these pitches are easily tuned by the person of average skill in the art and an appropriate match can easily be found by trial and error.

In embodiments, the self-assembled material may be a block copolymer, wherein the first portion may be one block of the block copolymer, and wherein the second portion may be another block of the block copolymer.

Block copolymer are advantageously known to self-assemble into different periodic patterns depending on their chemical nature and the length of the polymer chains in the different blocks. Examples include one block assembling into lines, also known as lamellae, cylinders or spheres in a matrix of another block. Furthermore, the self-assembly of the block copolymer can advantageously be guided through directed self-assembly.

In embodiments, the block copolymer may be a poly(styrene-block-methyl methacrylate) (PS-b-PMMA).

PS-b-PMMA is not only known to allow directed self-assembly but particular metal or ceramic material precursors, such as trimethylaluminium, can advantageously display a preferential absorption towards one of the two blocks, such as a selective absorption towards the PMMA blocks (acting here as the first portion of the self-assembled material). This advantageously allows one of the two blocks to be selectively hardened with the metal or ceramic material, for example through a sequential infiltration synthesis (SIS).

In other embodiments, the block copolymer may be a poly(styrene-block-2-vinylpyridine) (PS-b-P2VP) or a poly(styrene-block-lactic acid) (PS-b-PLA).

In embodiments wherein the further material is present, if the pattern is aligned with the underlying one or more zones of guiding material, the guiding material may have more wetting affinity for the first portion of the self-assembled material than for the second portion, and if the pattern is anti-aligned with the underlying one or more zones of guiding material, the guiding material may have less wetting affinity for the first portion of the self-assembled material than for the second portion.

Alignment of the pattern may be typically due to an advantageously different wetting affinity between the first and second portion of the self-assembled material towards the guiding and filler material. The wetting affinity of two materials may typically be related to the balance of cohesive and adhesive forces between these two materials. When the first portion of the self-assembled material displays a higher wetting affinity towards the guiding material, the pattern will typically be aligned with the one or more zones of guiding material. When the second portion of the self-assembled material displays a higher wetting affinity towards the guiding material, the pattern will typically be anti-aligned with the one or more zones of guiding material.

In embodiments, the pattern may be aligned with the underlying one or more zones of guiding material and the guiding material and the first portion of the self-assembled material may comprise a same material or a derivative of the same material.

The self-assembly of a self-assembled material comprising two portions may be typically due to a microphase separation of the two portions, which typically relates to strong cohesive forces within at least one of the portions. In such a case, these strong cohesive forces may advantageously be exploited to guide the self-assembly by using for the guiding material a same material, or a derivative, as used in the portion.

In embodiments, the same material may be poly(methyl methacrylate) (PMMA).

The self-assembled material may for example be a PS-b-PMMA block copolymer and the guiding material a cross linkable PMMA (X-PMMA).

In embodiments, if the pattern is aligned with the underlying one or more zones of guiding material, the first material may have more affinity for the guiding material than for the filler material, and if the pattern is anti-aligned with the underlying one or more zones of guiding material, the first material may have more affinity for the filler material than for the guiding material.

Alignment of the pattern can be achieved due to an advantageously different wetting affinity of the first material towards the guiding material and filler material. When the first material displays a higher wetting affinity towards the guiding material, the pattern may typically be aligned with the one or more zones of guiding material. When the first material displays a higher wetting affinity towards the filler material, the pattern may typically be anti-aligned with the one or more zones of guiding material.

In embodiments wherein the further material is present, if the pattern is aligned with the underlying one or more zones of guiding material, the further material may have more affinity for the filler material than for the guiding material, and if the pattern is anti-aligned with the underlying one more zones of guiding material, the further material may have more affinity for the guiding material than for the filler material.

Alignment of the pattern can be achieved due to an advantageously different wetting affinity of the further material towards the guiding and filler material. When the further material displays a higher wetting affinity towards the filler material, the pattern may typically be aligned with the one or more zones of guiding material. When the further material displays a higher wetting affinity towards the guiding material, the pattern may typically be anti-aligned with the one or more zones of guiding material.

In some embodiments, the alignment of the pattern may be due to a combination of differences in wetting affinity between a plurality of material couples.

In embodiments, the filler material may have as much wetting affinity for the first material as for the further material.

Since the zones of guiding material and the pattern of first material typically have a different pitch, such as the pitch of the former being a multiple of the latter, both the first material and the further material may typically be present above the filler material. As such, the wetting affinities of the filler material towards the first material and the second material may be advantageously such (e.g. sufficiently close) as to not to interfere with the guiding by the guiding material.

In embodiments, the self-assembled material may be a block copolymer comprising two or more polymerized monomers, and the filler material may be a random copolymer of two or more of the monomers.

In other embodiments, the filler material may be a blend of homopolymers of two or more of the monomers.

When the self-assembled material is a block copolymer comprising two or more blocks, i.e. a block copolymer comprising two or more polymerized monomers, a filler material with a sufficiently equal wetting affinity towards the first and the further material advantageously comprises a random copolymer, or a blend of homopolymers, of two or more of the monomers.

In embodiments, the random copolymer may be a poly(styrene-random-methyl methacrylate) (PS-r-PMMA)

The random copolymer may for example be a hydroxyl terminated PS-r-PMMA random copolymer with a PS volume fraction of 60% to 70%.

The random copolymer may for example be a hydroxyl terminated PS-r-PMMA random copolymer with a PS molar fraction of 60% to 70%.

In embodiments, the ceramic material may be an aluminium oxide.

Aluminium oxide can advantageously easily be obtained by oxidizing trimethylaluminium, e.g. with water as the oxidant.

In a second aspect, the present disclosure relates to a method for obtaining a patterned structure according to any of the previous claims, comprising:

a. providing a substrate,
b. forming, on top of the substrate, a first layer comprising a filler material and a guiding material, wherein at least a top surface of the first layer comprises one or more zones of filler material and one or more zones of guiding material, and
c. forming, on top of the first layer, a second layer comprising a pattern of a first material, the pattern being either aligned or anti-aligned with the underlying one or more zones of guiding material, and
e. infusing the first material with a metal or ceramic material, in such a way that the guiding material and the filler material either are both also infused with the metal or ceramic material or are both not infused with the metal or ceramic material.

The patterned structure according to the first aspect may advantageously be obtained by first forming a first layer, on top of the substrate, comprising the guiding and filler material, subsequently forming thereon a second layer comprising the pattern of a first material, aligned or anti-aligned with the one or more zones of guiding material and finally contacting, such as infusing, the first material with a metal or ceramic material. Infusing the first material with a metal or ceramic material advantageously results in a hardened first material.

In embodiments, infusing the first material with a metal or ceramic material may comprise exposing the first material to a first metal or ceramic material precursor and subsequently exposing the first material to a second metal or ceramic material precursor.

Infusing the first material with a metal or ceramic material can advantageously comprise exposing the first material to a first metal or ceramic material precursor, thereby typically absorbing the first metal or ceramic material precursor in the first material, and subsequently exposing the first material to a second metal or ceramic material precursor, thereby typically chemically reacting both precursors to form the metal or ceramic material. The first and second metal or ceramic material precursors are typically reagents in the formation the metal or ceramic material and are not typically metals or ceramic materials themselves. In some embodiments, the first and/or second metal or ceramic material precursors may be in a gaseous phase. In yet other embodiments, both the first and second metal or ceramic material precursors may be in a gaseous phase. Exposing the first material to a metal or ceramic material precursor may typically be performed in a reaction chamber, such as in an atomic layer deposition chamber. The reaction chamber may typically be purged before and/or after exposing the first material to a metal or ceramic material precursor, such as purging with an inert nitrogen gas. Purging the reaction chamber can advantageously allow contaminants and/or unreacted precursors to be removed from the chamber.

In embodiments, the second metal or ceramic material precursor may be an oxidant.

The infused ceramic material can advantageously be obtained through an oxidation of the first ceramic material precursor by means of the second ceramic material precursor (here typically an oxidant).

In embodiments, the first metal or ceramic material precursor may be trimethylaluminium and the second metal or ceramic material precursor may be an oxidant. In other embodiments, the first metal or metal precursor may be an organometallic compound.

The first metal or ceramic material precursor may advantageously be trimethylaluminium, which can be exposed to the first material as a vapour and is known to form aluminium oxide upon oxidation. Furthermore, trimethylaluminium is advantageously known to selectively absorb into certain materials, such as into PMMA.

In some embodiments, the oxidant may be water.

The oxidant may advantageously be water, which is a cheap reactant and which can be contacted with the first material as a vapour.

In embodiments, exposing the first material to a first metal or ceramic material precursor and subsequently exposing the first material to a second metal or ceramic material precursor may be repeated from 1 to 12 times, usually from 2 to 6 times.

In order to increase the concentration of metal or ceramic material in the first material, multiple cycles of exposing the first material to a first metal or ceramic material precursor and subsequently exposing the first material to a second metal or ceramic material precursor can advantageously be used. Furthermore, the metal or ceramic material that is synthesised in an earlier cycle can advantageously act as an adsorption site for a metal or ceramic material precursor, thereby increasing the amount of metal or ceramic material added in a later cycle as compared to an earlier cycle.

In embodiments, the second layer may additionally comprise a further material alongside the first material and infusing the first material may comprise preferentially infusing the first material with respect to the further material.

Infusing the metal or ceramic material can advantageously be performed preferentially towards the first material, so that the pattern comprising the first material can be preferentially hardened by the metal or ceramic material. After infusion, the concentration of metal or ceramic material may for example be higher in the first material than in the further material, such as 2 times higher or 4 times higher.

In some embodiments, preferentially infusing the first material with respect to the further material may comprise selectively infusing the first material with respect to the further material. The concentration of metal or ceramic material may for example be at least 9 times higher in the first material than in the further material. In some embodiments, after infusion of the second layer, the further material may not comprise the metal or ceramic material.

In embodiments, the second layer may comprise a self-assembled material.

In embodiments, the method may further comprise:
d. removing the further material from the second layer.

The further material can be typically removed after hardening the first material with the metal or ceramic material. This advantageously allows a patterned second layer to be obtained which can be comprised of a hardened pattern of the first material, comprising the metal or ceramic material, and voids. This patterned second layer may advantageously be used in patterning the underlying layers, such a patterning the substrate.

In some embodiments, removing the further material from the second layer (300) may also partially remove the first material. However, the hardening of the first material can be typically such that at least the metal or ceramic material remains, maintaining the same pattern, and typically comprising at least a portion of first material.

In any embodiment of the second aspect, the substrate, the first layer, the second layer, the metal, and the ceramic material, may be as defined in any embodiment of the first aspect.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

EXAMPLE 1

Fabricating and Using a Patterned Structure According to the Present Disclosure

A patterned structure according to an embodiment of the present disclosure was made and used in patterning the substrate (100).

We now refer to FIG. 1. A substrate (100) was provided, comprising a Si wafer (110) and a spin-on-glass (SOG) hardmask (120) thereon. Lines of cross linkable PMMA (X-PMMA) guiding material (210) were lithographically fabricated onto this hardmask (120).

Figure 2:
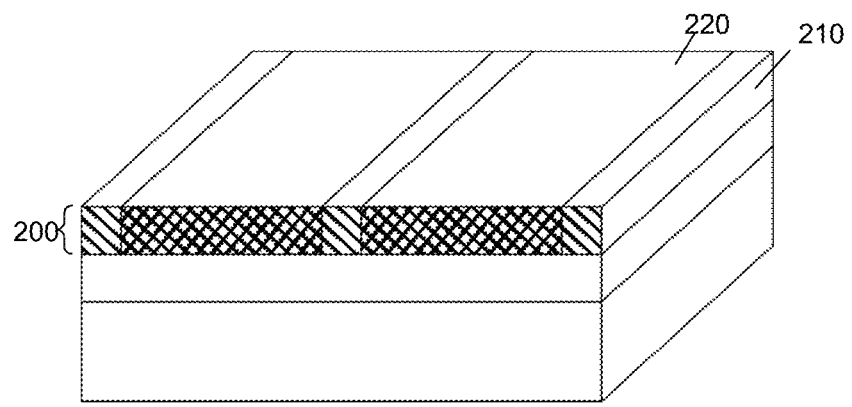
FIG. 2 show a schematic representation of a step in a sequence of steps to obtain and use a patterned structure according to an embodiment of the present disclosure. The gaps between the lines of X-PMMA guiding material (210) were filled with a PS-r-PMMA filler material (220) and subsequently annealed, completing the first layer (200). The thickness of the PS-r-PMMA filler material (220) was largely determined by its molecular weight, which was tuned to match the thickness of the X-PMMA guiding material (210), thus obtaining a first layer (200) with a planar surface.

We now refer to FIG. 2. The gaps between the lines of X-PMMA guiding material (210) were filled with a PS-r-PMMA filler material (220) and subsequently annealed, completing the first layer (200). The thickness of the PS-r-PMMA filler material (220) was largely determined by its molecular weight, which was tuned to match the thickness of the X-PMMA guiding material (210), thus obtaining a first layer (200) with a planar surface.

Figure 3:
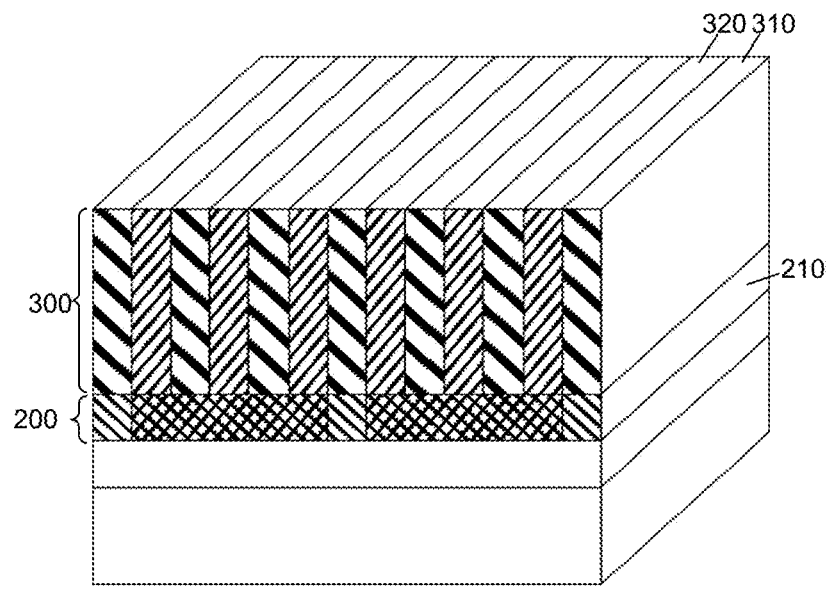
FIG. 3 shows a schematic representation of a step in a sequence of steps to obtain and use a patterned structure according to an embodiment of the present disclosure. A PS-b-PMMA block copolymer second layer (300) was self-assembled onto the first layer (200). Due to the wetting affinity of the PMMA sections (310) towards the X-PMMA guiding material (210), while neither the PS (320) nor the PMMA sections (310) have a specific wetting affinity towards the PS-r-PMMA filler material (220), the self-assembly of the block copolymer was such that sections of PMMA (310) aligned to the underlying lines of guiding material (210).

We now refer to FIG. 3. A PS-b-PMMA block copolymer second layer (300) was self-assembled onto the first layer (200). Due to the wetting affinity of the PMMA sections (310) towards the X-PMMA guiding material (210), while neither the PS (320) nor the PMMA sections (310) have a specific wetting affinity towards the PS-r-PMMA filler material (220), the self-assembly of the block copolymer was such that sections of PMMA (310) aligned to the underlying lines of guiding material (210).

Figure 4:
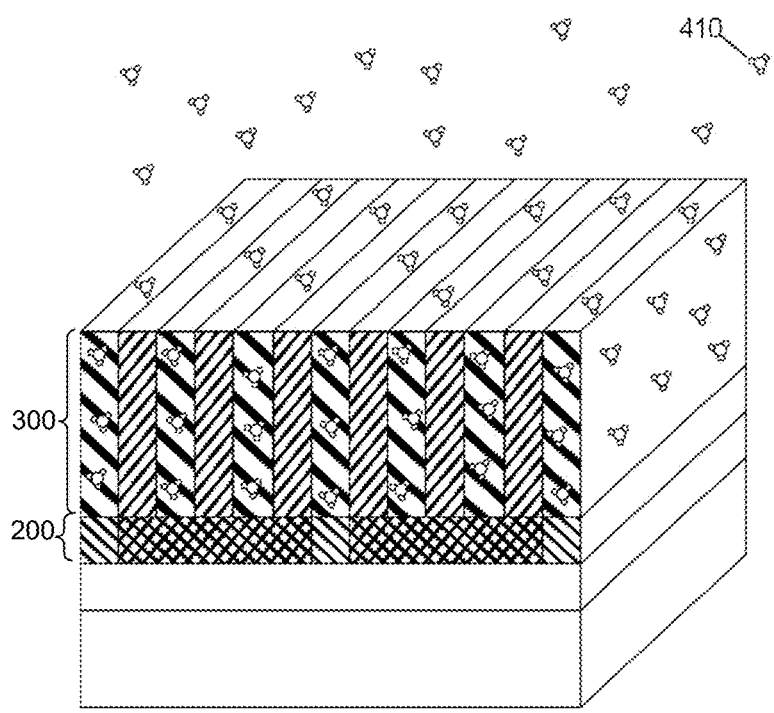
FIG. 4 shows a schematic representation of a step in a sequence of steps to obtain and use a patterned structure according to an embodiment of the present disclosure. The structure was introduced into an atomic layer deposition (ALD) chamber where it was exposed to TMA (410) and nitrogen carrier gas for a pre-determined time, as part of the first half of the SIS cycle. The pre-determined time depended on the partial pressure of the TMA (410), the temperature and the film thickness, typically ranging from a few seconds to up to 10 minutes. The TMA (410) diffused into both the second layer (300) and first layer (200) and selectively bound with the PMMA molecules.

We now refer to FIG. 4. The structure was introduced into an atomic layer deposition (ALD) chamber where it was exposed to TMA (410) and nitrogen carrier gas for a pre-determined time, as part of the first half of the SIS cycle. The pre-determined time depended on the partial pressure of the TMA (410), the temperature and the film thickness, typically ranging from a few seconds to up to 10 minutes. The TMA (410) diffused into both the second layer (300) and first layer (200) and selectively bound with the PMMA molecules. Without being bound by theory, it is believed that this binding of TMA (410) and PMMA can primarily be due to an adsorption mechanism with a small contribution from covalent bonding. The selectivity of the binding process to PMMA can be related to the carbonyl moiety in the PMMA which is absent in the aromatic PS. To complete the first half of the cycle the chamber was purged with nitrogen which removed any unreacted TMA (410) from the chamber.

Figure 5:
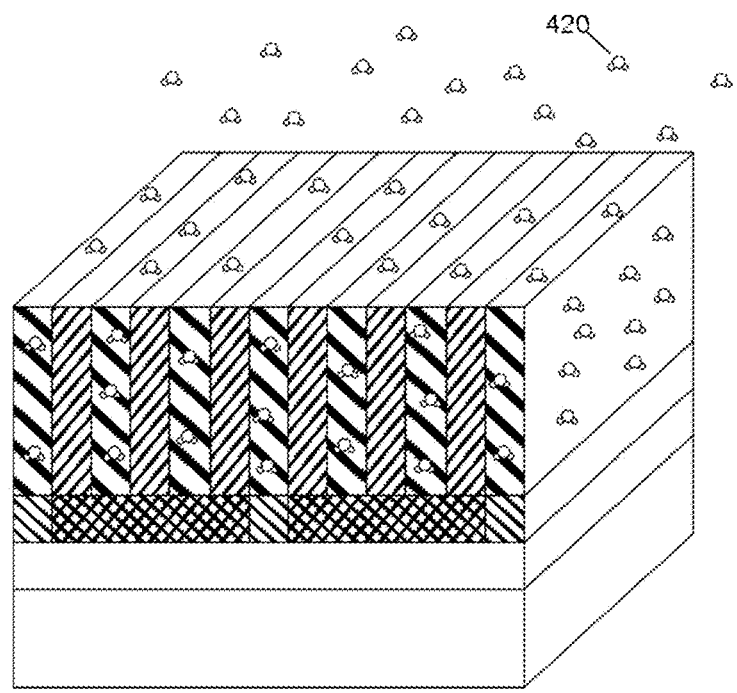
FIG. 5 shows a schematic representation of a step in a sequence of steps to obtain and use a patterned structure according to an embodiment of the present disclosure. The second half of the SIS cycle began with the introduction of water (420) into the chamber. This water (420) oxidized the TMA (410) previously infiltrated in the PMMA sections to form alumina. There was no reaction between water (420) and PS in the process conditions employed. The second half of the SIS cycle was completed by a nitrogen purge to remove unreacted water molecules (420) from the chamber.

We now refer to FIG. 5. The second half of the SIS cycle began with the introduction of water (420) into the chamber. This water (420) oxidized the TMA (410) previously infiltrated in the PMMA sections to form alumina. There was no reaction between water (420) and PS in the process conditions employed. The second half of the SIS cycle was completed by a nitrogen purge to remove unreacted water molecules (420) from the chamber.

Figure 6:
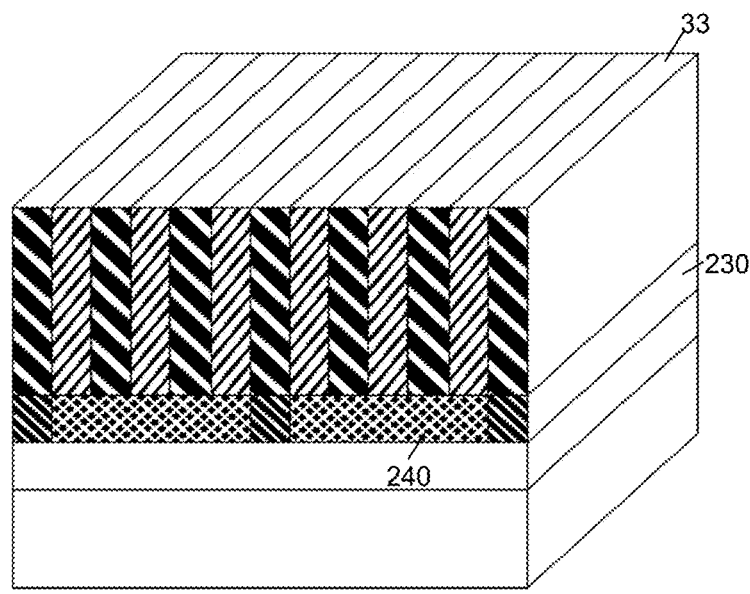
FIG. 6 shows a schematic representation of a step in a sequence of steps to obtain and use a patterned structure according to an embodiment of the present disclosure. The above TMA (410) and water (420) cycle was repeated a few times to achieve multiple SIS cycles. In subsequent cycles, the alumina generated in previous cycles provided additional sites for TMA (410) to adsorb. A structure was obtained comprising alumina hardened sections of PMMA first material (330), X-PMMA guiding material (230) and PS-r-PMMA filler material (240).

We now refer to FIG. 6. The above TMA (410) and water (420) cycle was repeated a few times to achieve multiple SIS cycles. In subsequent cycles, the alumina generated in previous cycles provided additional sites for TMA (410) to adsorb. A structure was obtained comprising alumina hardened sections of PMMA first material (330), X-PMMA guiding material (230) and PS-r-PMMA filler material (240).

Figure 7:
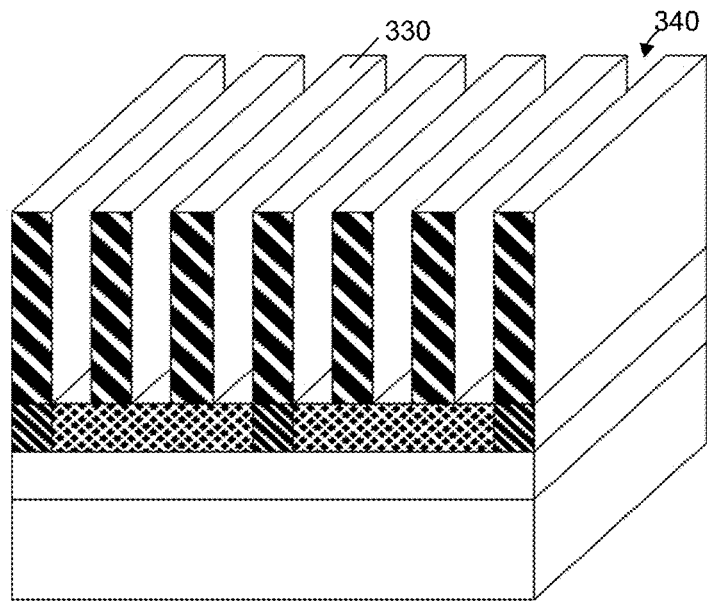
FIG. 7 shows a schematic representation of a step in a sequence of steps to obtain and use a patterned structure according to an embodiment of the present disclosure. After the desired number of SIS cycles had been executed the wafer was removed from the ALD chamber and introduced into a plasma etcher in order to oxidatively remove the sections of PS further material (320) as well as partially removing the PMMA, using an $Ar/O_2$ plasma; leaving the lines of alumina comprising first material (330) and trenches (340).

We now refer to FIG. 7. After the desired number of SIS cycles had been executed the wafer was removed from the ALD chamber and introduced into a plasma etcher in order to oxidatively remove the sections of PS further material (320) as well as partially removing the PMMA, using an Ar/O$_2$ plasma; leaving the lines of alumina comprising first material (330) and trenches (340).

Figure 8:
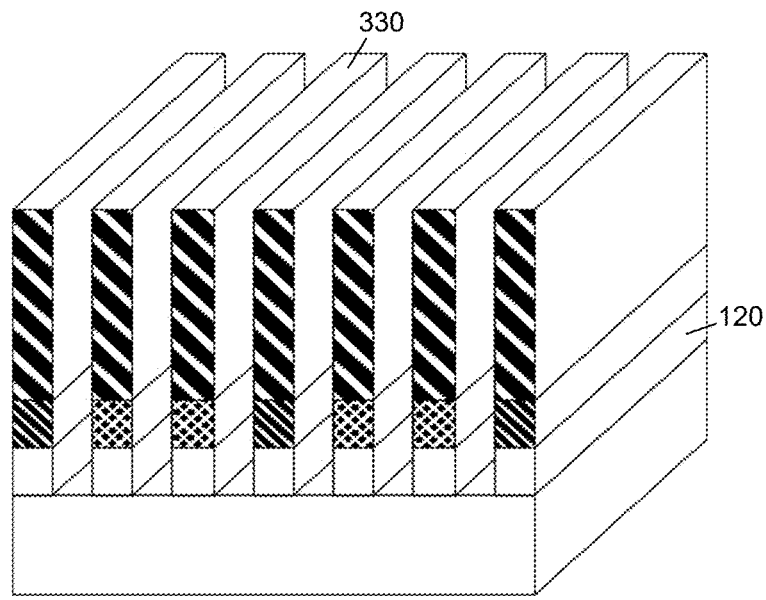
FIG. 8 shows a schematic representation of a step in a sequence of steps to obtain and use a patterned structure according to an embodiment of the present disclosure. By means of a tetrafluoromethane ($CF_4$), or another fluorine, based plasma etching, the lines of first material (330) were used as an etch mask and the pattern was transferred into the SOG hardmask (120).

We now refer to FIG. 8. By means of a tetrafluoromethane (CF$_4$), or another fluorine, based plasma etching, the lines of first material (330) were used as an etch mask and the pattern was transferred into the SOG hardmask (120).

EXAMPLE 2

Comparison Between the Hardened Pattern of the Conventional Method and the Present Disclosure The steps in making the patterned structure according to embodiments of the present disclosure (part b of FIGS. 9 to 12) will be compared to a conventional method (part a of FIGS. 9 to 12).

Figure 9:
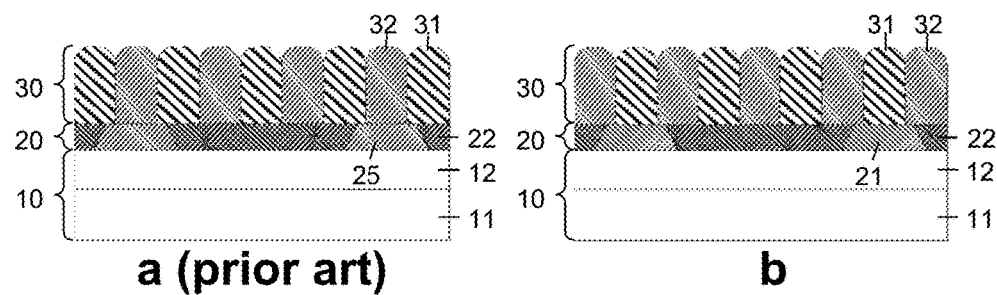
FIG. 9 shows a schematic comparison between (part a) a conventional method and (part b) an embodiment of the present disclosure.

We now refer to FIG. 9. We start from a structure comprising a substrate (100) with a hardmask layer (120), a first layer (200) with zones of guiding material (250, 210) in a matrix of filler material (220) and a second layer (300) comprising a pattern of a first material (310) in a matrix of a further material (320). The second layer (300) may for example comprise a self-assembled PS-b-PMMA block copolymer, comprising sections of PMMA first material (310) and sections of PS further material (320). The structure of the present disclosure differs at this point from a structure prepared by a convention method in the nature of the guiding material (250, 210): in conventional methods (FIG. 9, part a), a material (250) that is similar to the further material (320) can be used, such as a cross linkable PS (X-PS); whereas the present disclosure (FIG. 9, part b) can use a material (210) that may be similar to the first material (310), such as a cross linkable PMMA (X-PMMA). The filler material (220) can be in both cases a material that is similar to the combination of the first and further material (320), such as a PS-r-PMMA random copolymer. Due to the difference in guiding material (210), the alignment of the pattern in the second layer (300) can be shifted accordingly.

Figure 10:
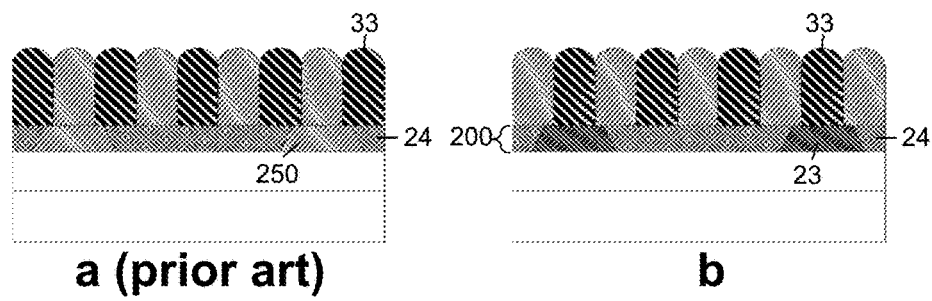
FIG. 10 shows a schematic comparison between (part a) a conventional method and (part b) an embodiment of the present disclosure.

We now refer to FIG. 10. A metal or ceramic material can be infused into the first material (310), preferentially with respect to the further material (320); for example the PMMA first material (310) may be hardened with aluminium oxide by means of SIS using trimethylaluminium (410) and water (420). In both cases, the metal or ceramic material can penetrate through the second layer (300), opening up the possibility of infusing the materials in the first layer (200). As the filler material (220) comprises a material that is similar to the first material (310), the metal or ceramic material can also be preferentially infused in the filler material (240). Since conventional methods (FIG. 10, part a) use a guiding material (250) that is similar to the further material (320), the guiding material (250) is not infused; thus parts of the first layer (200) (i.e. the guiding material (250)) ends up not being infused. Contrarily, the present disclosure (FIG. 10, part b) uses a guiding material (210) that is similar to the first material (310), thus the guiding material (230) can be preferentially infused as well and the whole first layer (200) ends up being infused.

Figure 11:
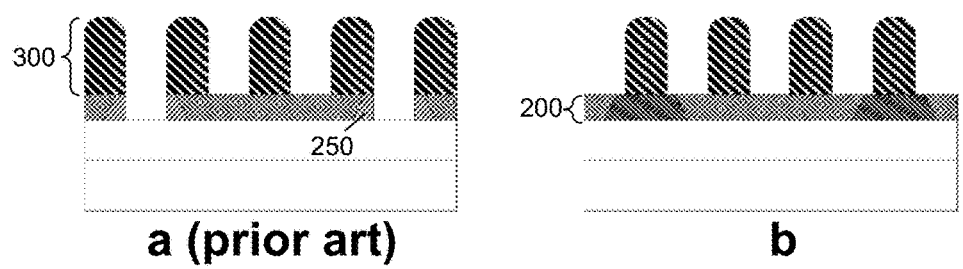
FIG. 11 shows a schematic comparison between (part a) a conventional method and (part b) an embodiment of the present disclosure.

We now refer to FIG. 11. The further material (320) is removed from the second layer (300). In conventional methods (FIG. 11, part a), using a guiding material (250) similar to the further material (320), any overetching leads to the pattern of the second layer (300) being partially transferred into the guiding material (250). Conversely, in the present disclosure, due to the whole first layer (200) being infused, at least the metal or ceramic material remains in place in the first layer (FIG. 11, part b).

Figure 12:
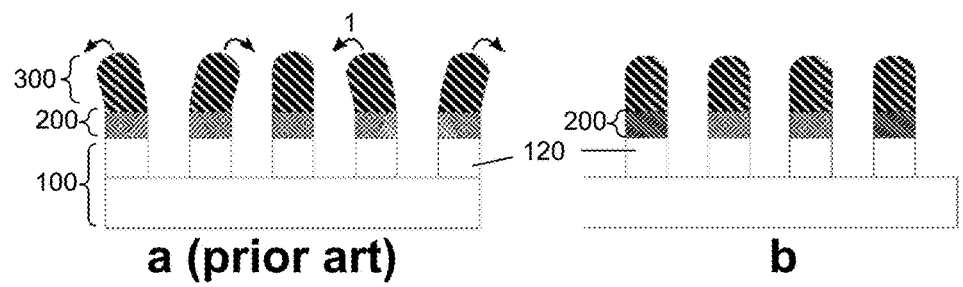
FIG. 12 shows a schematic comparison between (part a) a conventional method and (part b) an embodiment of the present disclosure.

We now refer to FIG. 12. The pattern is further transferred into the hardmask layer (120). In conventional cases, the non-uniform infusion of the first layer (200) influences the pattern of the second layer (300), leading to toppling (1) of its features and pitch walking; this in turn can affect the pattern which is transferred into the hardmask (120) and any further patterned layers in the substrate (100). See FIG. 12, part a. However, in the present disclosure, the whole first layer (200) may be infused and no toppling or pitch walking occur. See FIG. 12, part b.

Figure 13:
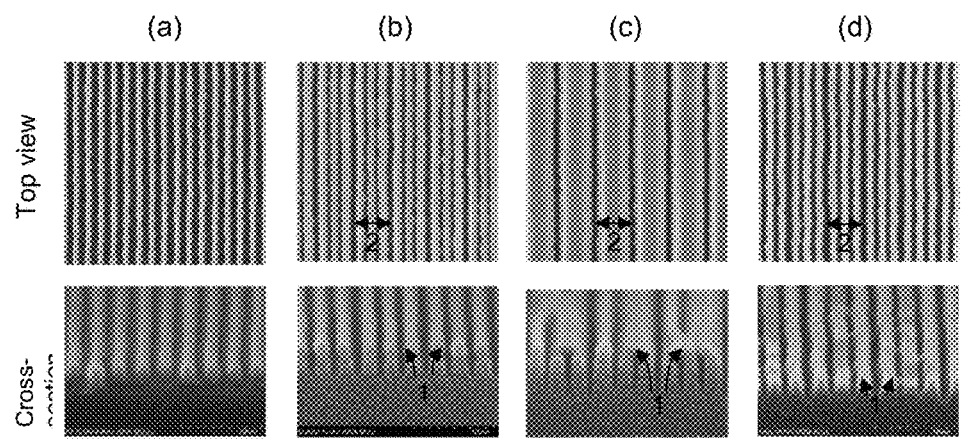
FIG. 13 shows top down critical dimension scanning electron microscope (CD-SEM) and cross section X-ray scanning electron microscope (X-SEM) images of different steps of the formation of the patterned structure and subsequent pattern transfer according to conventional methods are provided in support of the previous schematic representations. Part (a) corresponds to an image after removal of the further material; part (b) correspond to an image after pattern transfer into the hardmask; part (c) corresponds to an image after further pattern transfer; and part (d) corresponds to an image after removal of the metal oxide.

We now refer to FIG. 13. Top down critical dimension scanning electron microscope (CD-SEM) and cross section X-ray scanning electron microscope (X-SEM) images of different steps of the formation of the patterned structure and subsequent pattern transfer according to conventional methods are provided in support of the previous schematic representations. FIG. 13, part a, corresponds to an image after removal of the further material; FIG. 13, part b, correspond to an image after pattern transfer into the hardmask; FIG. 13, part c, corresponds to an image after further pattern transfer; and FIG. 13, part d, corresponds to an image after removal of the metal oxide. The materials used were a substrate (100) comprising silicon (110) overlaid with a $Si_3N_4$ hardmask (120), X-PS guiding material (250), PS-r-PMMA filler material (220), PMMA first material (310) and PS further material (320) forming together a PS-b-PMMA self-assembled block copolymer and aluminium oxide SIS infusion using trimethylaluminium (410) and water (420). Examples of toppling (1) and pitch walking (2) of the pattern features are indicated in the different figures.

Figure 14:
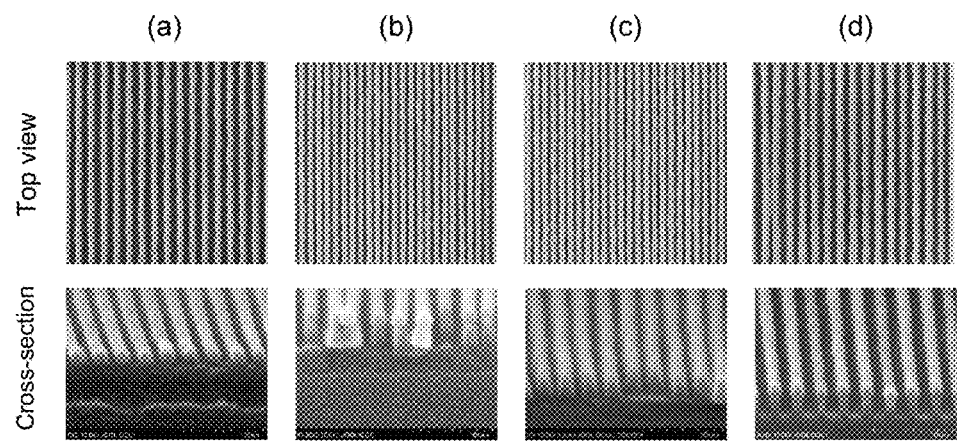
FIG. 14 shows top down CD-SEM and cross section X-SEM images of different steps of the formation of the patterned structure and subsequent pattern transfer according to the present disclosure. Part (a) corresponds to an image after removal of the further material; part (b), correspond to an image after pattern transfer into the hardmask; part (c) corresponds to an image after removal of the metal oxide; and part (d) corresponds to an image after further pattern transfer.

We now refer to FIG. 14. Top down CD-SEM and cross section X-SEM images of different steps of the formation of the patterned structure and subsequent pattern transfer according to the present disclosure are provided in support of the previous schematic representations. FIG. 14, part a, corresponds to an image after removal of the further material; FIG. 14, part b, correspond to an image after pattern transfer into the hardmask; FIG. 14, part c, corresponds to an image after removal of the metal oxide; and FIG. 14, part d, corresponds to an image after further pattern transfer. The materials used were a substrate (100) comprising silicon overlaid with a spin-on-carbon transfer layer and a spin-on-glass hardmask (120), X-PMMA guiding material (210), PS-r-PMMA filler material (220), PMMA first material (310) and PS further material (320) forming together a PS-b-PMMA self-assembled block copolymer and aluminium oxide SIS infusion using trimethylaluminium (410) and water (420). No toppling (1) or pitch walking (2) of the pattern features similar to FIG. 13 can be distinguished.

It is to be understood that although embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed:

1. A patterned structure, comprising:
   i) a substrate;
   ii) a first layer on top of the substrate, comprising a filler material and a guiding material, wherein at least a top surface of the first layer comprises one or more zones of filler material and one or more zones of guiding material; and
   iii) a second layer on top of the first layer comprising a pattern of a first material, the pattern being either aligned or anti-aligned with the underlying one or more zones of guiding material;

wherein the first material comprises a metal or a ceramic material and wherein the guiding material and the filler material both comprise the metal or ceramic material.

2. The patterned structure according to claim 1, wherein the pattern of the first material comprises parallel lines and wherein the second layer comprises these parallel lines alternated with parallel lines of a further material and/or with voids.

3. The patterned structure according to claim 2, wherein the pattern of the first material comprises a first portion of a self-assembled material and wherein the further material, if present, comprises a second portion of the self-assembled material.

4. The patterned structure according to claim 3, wherein the self-assembled material is a block copolymer, wherein the first portion is one block of the block copolymer, and wherein the second portion is another block of the block copolymer.

5. The patterned structure according to claim 3, wherein the further material is present, wherein if the pattern is aligned with the underlying one or more zones of guiding material, the guiding material has more wetting affinity for the first portion of the self-assembled material than for the second portion, and wherein if the pattern is anti-aligned with the underlying one or more zones of guiding material, the guiding material has less wetting affinity for the first portion of the self-assembled material than for the second portion.

6. The patterned structure according to claim 5, wherein the pattern is aligned with the underlying one or more zones of guiding material and wherein the guiding material and the first portion of the self-assembled material comprise a same material or a derivative of the same material.

7. The patterned structure according to claim 3, wherein if the pattern is aligned with the underlying one or more zones of guiding material, the first material has more wetting affinity for the guiding material than for the filler material, and wherein if the pattern is anti-aligned with the underlying one or more zones of guiding material, the first material has more wetting affinity for the filler material than for the guiding material.

8. The patterned structure according to claim 7, wherein the further material is present, wherein if the pattern is aligned with the underlying one or more zones of guiding material, the further material has more wetting affinity for the filler material than for the guiding material, and wherein if the pattern is anti-aligned with the underlying one more zones of guiding material, the further material has more wetting affinity for the guiding material than for the filler material.

9. The patterned structure according to claim 7, wherein the filler material has as much wetting affinity for the first material as for the further material.

10. The patterned structure according to claim 7, wherein the self-assembled material is a block copolymer comprising two or more polymerized monomers and wherein the filler material is a random copolymer of two or more of the monomers.

11. A method for obtaining a patterned structure according to claim 1, comprising:
 a) providing a substrate;
 b) forming, on top of the substrate, a first layer comprising a filler material and a guiding material, wherein at least a top surface of the first layer comprises one or more zones of filler material and one or more zones of guiding material;
 c) forming, on top of the first layer, a second layer comprising a self-assembled material and comprising a pattern of a first material, the pattern being either aligned or anti-aligned with the underlying one or more zones of guiding material; and
 d) infusing the first material with a metal or ceramic material, in such a way that the guiding material and the filler material are both also infused with the metal or ceramic material.

12. The method according to claim 11, wherein infusing the first material with a metal or ceramic material comprises exposing the first material to a first metal or ceramic material precursor and subsequently exposing the first material to a second metal or ceramic material precursor.

13. The method according to claim 12, wherein exposing the first material to a first metal or ceramic material precursor and subsequently exposing the first material to a second metal or ceramic material precursor is repeated from 1 to 12 times.

14. The method according to claim 12, wherein exposing the first material to a first metal or ceramic material precursor and subsequently exposing the first material to a second metal or ceramic material precursor is repeated from 2 to 6 times.

15. The method according to claim 11, wherein the second layer additionally comprises a further material alongside the first material and wherein infusing the first material comprises preferentially infusing the first material with respect to the further material.

16. The method according to claim 11, wherein the ceramic material is metal oxide or metal nitride.

17. The method according to claim 11, wherein the guiding material and filler material comprise a monomer.

18. The method according to claim 11, wherein the self-assembled material is a block copolymer.

19. The method according to claim 18, wherein the block copolymer comprises poly(styrene-block-methyl methacrylate) (PS-b-PMMA), poly(styrene-block-2-vinylpyridine) (PS-b-P2VP) or a poly(styrene-block-lactic acid) (PS-b-PLA).

20. The method according to claim 11, wherein self-assembled material is PS-b-PMMA block copolymer and the guiding material is a cross linkable PMMA (X-PMMA).

21. The patterned structure according to claim 4, wherein the block copolymer comprises poly(styrene-block-methyl methacrylate) (PS-b-PMMA), poly(styrene-block-2-vinylpyridine) (PS-b-P2VP) or a poly(styrene-block-lactic acid) (PS-b-PLA).

22. The patterned structure according to claim 4, wherein self-assembled material is PS-b-PMMA block copolymer and the guiding material is a cross linkable PMMA (X-PMMA).

23. The patterned structure according to claim 1, wherein the ceramic material is metal oxide or metal nitride.

* * * * *